(12) United States Patent
Rokhsaz

(10) Patent No.: US 10,727,814 B2
(45) Date of Patent: *Jul. 28, 2020

(54) METHOD AND APPARATUS OR SENSING ENVIRONMENTAL CONDITIONS

(71) Applicant: RFMicron, Inc., Austin, TX (US)

(72) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/228,671

(22) Filed: Dec. 20, 2018

(65) Prior Publication Data

US 2019/0149135 A1    May 16, 2019

Related U.S. Application Data

(60) Continuation of application No. 15/665,251, filed on Jul. 31, 2017, now Pat. No. 10,164,611, which is a
(Continued)

(51) Int. Cl.
*H03J 3/04* (2006.01)
*H03H 7/40* (2006.01)
(Continued)

(52) U.S. Cl.
CPC ............ *H03J 3/04* (2013.01); *G06K 7/10148* (2013.01); *G06K 7/10336* (2013.01);
(Continued)

(58) Field of Classification Search
CPC ............ H03J 3/20; H03J 2200/10; H03J 5/02; H03H 7/40; G06F 15/16; G06K 7/10148;
(Continued)

(56) References Cited

U.S. PATENT DOCUMENTS 6,735,630 B1    5/2004  Gelvin et al.
7,706,770 B2    4/2010  Rofougaran
(Continued)

OTHER PUBLICATIONS

Wang et al., "A Passive Wireless Temperature Sensor for Harsh Environment Applications", Sensors 2008, vol. 8, pp. 7982-7995. (Year: 2008).*

*Primary Examiner* — Benny T Lee
*Assistant Examiner* — Hafizur Rahman
(74) *Attorney, Agent, or Firm* — Garlick & Markison; Timothy W. Markison

(57) ABSTRACT

A wireless sensor includes a radio frequency (RF) receiving circuit operable to receive an RF signal having a carrier frequency of a plurality of carrier frequencies. The RF receiving circuit further includes a variable impedance where impedance of the variable impedance is a factor in establishing a resonant frequency of the RF receiving circuit. The wireless sensor further includes a processing module that is operable to determine a first value for a first impedance of the variable impedance for a known temperature based on the resonant frequency and the carrier frequency, determine a second value a second impedance of the variable impedance for an unknown temperature based on the resonant frequency and the carrier frequency, and determine a difference between the first and second values that corresponds to a change between the known temperature and the unknown temperature.

18 Claims, 6 Drawing Sheets

Related U.S. Application Data continuation-in-part of application No. 14/727,253, filed on Jun. 1, 2015, now Pat. No. 9,991,596, and a continuation-in-part of application No. 14/256,877, filed on Apr. 18, 2014, now Pat. No. 9,785,807, which is a continuation-in-part of application No. 13/209,420, filed on Aug. 14, 2011, now Pat. No. 8,749,319, and a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, said application No. 14/256,877 is a continuation-in-part of application No. 13/467,925, filed on May 9, 2012, now Pat. No. 10,224,902, which is a continuation-in-part of application No. 13/209,425, filed on Aug. 14, 2011, now Pat. No. 9,048,819.

(60) Provisional application No. 62/004,941, filed on May 30, 2014, provisional application No. 62/004,943, filed on May 30, 2014, provisional application No. 62/011,116, filed on Jun. 12, 2014, provisional application No. 62/131,414, filed on Mar. 11, 2015, provisional application No. 61/428,170, filed on Dec. 29, 2010, provisional application No. 61/485,732, filed on May 13, 2011, provisional application No. 61/814,241, filed on Apr. 20, 2013, provisional application No. 61/833,150, filed on Jun. 10, 2013, provisional application No. 61/833,167, filed on Jun. 10, 2013, provisional application No. 61/833,265, filed on Jun. 10, 2013, provisional application No. 61/871,167, filed on Aug. 28, 2013, provisional application No. 61/875,599, filed on Sep. 9, 2013, provisional application No. 61/896,102, filed on Oct. 27, 2013, provisional application No. 61/929,017, filed on Jan. 18, 2014, provisional application No. 61/934,935, filed on Feb. 3, 2014.

(51) Int. Cl.
 *H03J 3/20* (2006.01)
 *G06K 7/10* (2006.01)
 *G06K 19/07* (2006.01)
 *H04B 5/00* (2006.01)
 *H04W 4/20* (2018.01)
 *H04W 4/80* (2018.01)
 *H04W 4/70* (2018.01)

(52) U.S. Cl.
 CPC ..... *G06K 19/0717* (2013.01); *G06K 19/0723* (2013.01); *H03H 7/40* (2013.01); *H03J 3/20* (2013.01); *H04B 5/0062* (2013.01); *H04B 5/0081* (2013.01); *H04W 4/20* (2013.01); *H04W 4/80* (2018.02); *H03J 2200/10* (2013.01); *H04W 4/70* (2018.02)

(58) Field of Classification Search
 CPC ........... G06K 7/10336; G06K 19/0717; G06K 19/0723; H01Q 1/2225; H01Q 1/36; H01Q 1/38; H01Q 7/005; H01Q 9/0407; H01Q 9/285; H01Q 13/106; H01Q 7/40; H04B 5/0062; H04B 5/0081; H04W 4/005
 USPC ....... 333/17.1, 17.3; 706/33; 709/19, 20, 83, 709/224, 200
 See application file for complete search history.

(56) References Cited

U.S. PATENT DOCUMENTS

| | | |
|---|---|---|
| 8,710,983 B2 | 4/2014 | Malkowski |
| 10,164,611 B2 * | 12/2018 | Rokhsaz .................. H03J 3/04 |
| 2005/0212604 A1 | 9/2005 | Cyr |
| 2010/0198039 A1 * | 8/2010 | Towe .................. A61B 5/0031 600/373 |

* cited by examiner wireless communication system 10

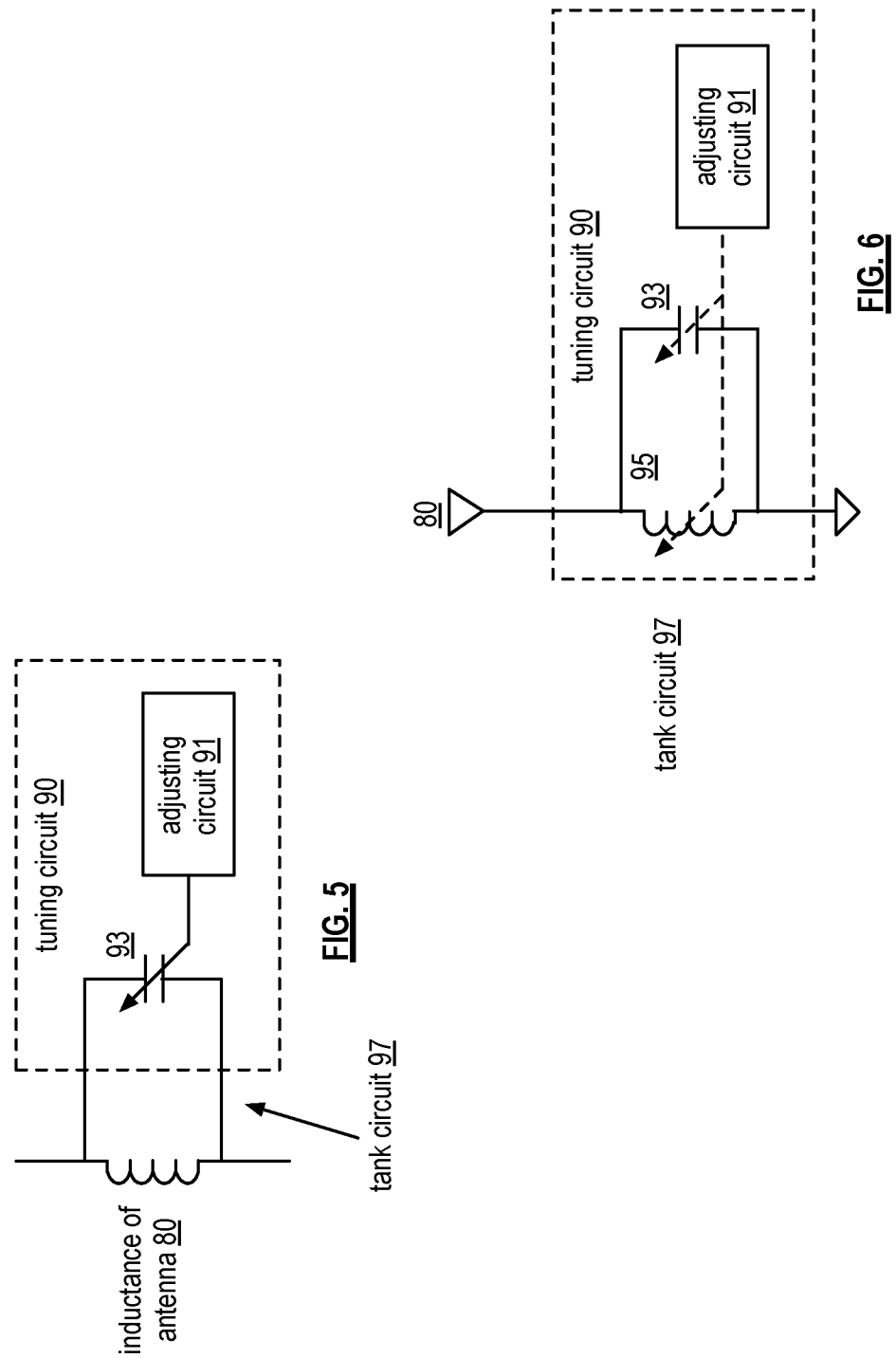

METHOD AND APPARATUS OR SENSING ENVIRONMENTAL CONDITIONS

CROSS REFERENCE TO RELATED APPLICATIONS

The present U.S. Utility Patent Application claims priority pursuant to 35 U.S.C. § 120 as a continuation of U.S. Utility application Ser. No. 15/665,251, entitled "METHOD AND APPARATUS FOR SENSING ENVIRONMENTAL CONDITIONS", filed Jul. 31, 2017, issuing as U.S. Pat. No. 10,164,611 on Dec. 25, 2018, which claims priority pursuant to 35 U.S.C. § 120 as a continuation-in-part of U.S. Utility application Ser. No. 14/727,523, entitled "Method and Apparatus for Sensing Environmental Parameters Using Wireless Sensor(s)," filed Jun. 1, 2015, now U.S. Pat. No. 9,991,596, issued on Jun. 5, 2018, which claims priority pursuant to 35 U.S.C. § 119(e) to U.S. Provisional Application No. 62/004,941, entitled "Pressure/Proximity Sensors Reference Design," filed May 30, 2014; U.S. Provisional Application No. 62/004,943, entitled "Method and Apparatus for Varying an Impedance," filed May 30, 2014; U.S. Provisional Application No. 62/011,116, entitled "Method and Apparatus for Sensing Water Level Using Wireless Sensor(s)," filed Jun. 12, 2014; and U.S. Provisional Application No. 62/131,414, entitled "Method and Apparatus for Variable Capacitor Control," filed Mar. 11, 2015, all of which are hereby incorporated herein by reference in their entirety and made part of the present U.S. Utility Patent Application for all purposes.

U.S. Utility Patent application Ser. No. 14/727,523 also claims priority pursuant to 35 U.S.C § 120 as a continuation-in-part of U.S. Utility application Ser. No. 14/256,877, entitled "METHOD AND APPARATUS FOR SENSING ENVIRONMENT USING A WIRELESS PASSIVE SENSOR", filed Apr. 18, 2014, now U.S. Pat. No. 9,785,807, issued on Oct. 10, 2017, which claims priority pursuant to 35 U.S.C. § 119(e) to U.S. Provisional Application No. 61/814,241, entitled "RFID ENVIRONMENTAL SENSOR", filed Apr. 20, 2013; U.S. Provisional Application No. 61/833,150, entitled "RESONANT ANTENNA", filed Jun. 10, 2013; U.S. Provisional Application No. 61/833,167, entitled "RFID TAG", filed Jun. 10, 2013; U.S. Provisional Application No. 61/833,265, entitled "RFID TAG", filed Jun. 10, 2013; U.S. Provisional Application No. 61/871,167, entitled "RESONANT ANTENNA", filed Aug. 28, 2013; U.S. Provisional Application No. 61/875,599, entitled "CMF ACCURATE SENSOR", filed Aug. 9, 2013; U.S. Provisional Application No. 61/896,102, entitled "RESONANT ANTENNA", filed Oct. 27, 2013; U.S. Provisional Application No. 61/929,017, entitled "RFID ENVIRONMENTAL SENSOR", filed Jan. 18, 2014; U.S. Provisional Application No. 61/934,935, entitled "RFID ENVIRONMENTAL SENSOR", filed Feb. 3, 2014; all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,420, entitled "METHOD AND APPARATUS FOR DETECTING RF FIELD STRENGTH", filed Aug. 14, 2011, now U.S. Pat. No. 8,749,319, issued on Jun. 10, 2014, which claims priority pursuant to 35 U. S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,420 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/467,925, entitled "ROLL-TO-ROLL PRODUCTION OF RFID TAGS", filed May 9, 2012, which is a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

BACKGROUND OF THE INVENTION

Technical Field of the Invention

This application relates generally to wireless data communication systems and more particularly to processing data representative of environmental sensed conditions.

Description of Related Art

Wireless communication systems are known to include wireless transceivers that communication directly and/or over a wireless communication infrastructure. In direct wireless communications, a first wireless transceiver includes baseband processing circuitry and a transmitter to convert data into a wireless signal (e.g., radio frequency (RF), infrared (IR), ultrasound, near field communication (NFC), etc.). Via the transmitter, the first wireless transceiver transmits the wireless signal. When a second wireless transceiver is in range (e.g., is close enough to the first wireless transceiver to receive the wireless signal at a sufficient power level), it receives the wireless signal via a receiver and converts the signal into meaningful information (e.g., voice, data, video, audio, text, etc.) via baseband processing circuitry. The second wireless transceiver may wirelessly communicate back to the first wireless transceiver in a similar manner.

Examples of direct wireless communication (or point-to-point communication) include walkie-talkies, Bluetooth, ZigBee, Radio Frequency Identification (RFID), etc. As a more specific example, when the direct wireless communication is in accordance with RFID, the first wireless transceiver may be an RFID reader and the second wireless transceiver may be an RFID tag.

For wireless communication via a wireless communication infrastructure, a first wireless communication device transmits a wireless signal to a base station or access point, which conveys the signal to a wide area network (WAN) and/or to a local area network (LAN). The signal traverses the WAN and/or LAN to a second base station or access point that is connected to a second wireless communication device. The second base station or access point sends the signal to the second wireless communication device. Examples of wireless communication via an infrastructure include cellular telephone, IEEE 802.11, public safety systems, etc.

In many situations, direct wireless communication is used to gather information that is then communicated to a computer. For example, an RFID reader gathers information from RFID tags via direct wireless communication. At some later point in time (or substantially concurrently), the RFID reader downloads the gathered information to a computer via a direct wireless communication or via a wireless communication infrastructure.

In many RFID systems, the RFID tag is a passive component. As such, the RFID tag has to generate one or more supply voltages from the RF signals transmitted by the RFID reader. Accordingly, a passive RFID tag includes a power supply circuit that converts the RF signal (e.g., a continuous wave AC signal) into a DC power supply voltage. The power supply circuit includes one or more diodes and one or more capacitors. The diode(s) function to rectify the AC signal and the capacitor(s) filter the rectified signal to produce the DC power supply voltage, which powers the circuitry of the RFID tag.

Once powered, the RFID tag receives a command from the RFID reader to perform a specific function. For example, if the RFID tag is attached to a particular item, the RFID tag stores a serial number, or some other identifier, for the item. In response to the command, the RFID tag retrieves the stored serial number and, using back-scattering, the RFID tag transmits the retrieved serial number to the RFID reader.

BRIEF DESCRIPTION OF THE SEVERAL VIEWS OF THE DRAWING(S)

FIG. 5 is a schematic block diagram of an example of a plurality of components of a radio frequency (RF) receiving circuit in accordance with the present invention;

FIG. 6 is a schematic block diagram of another example of a plurality of components of a radio frequency (RF) receiving circuit in accordance with the present invention.

DETAILED DESCRIPTION OF THE INVENTION

Figure 1:
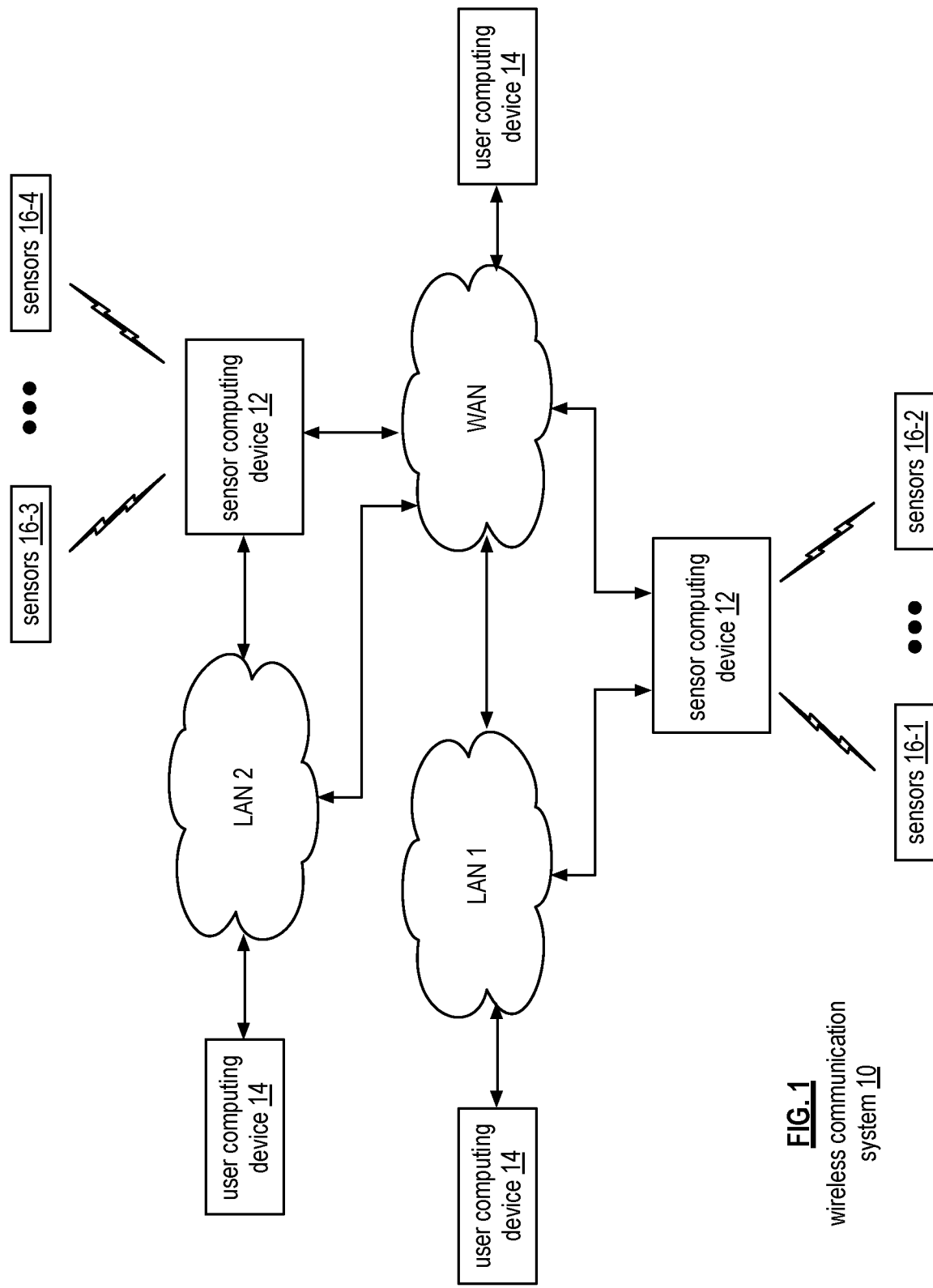
FIG. 1 is a schematic block diagram of an embodiment of a communication system in accordance with the present invention.

FIG. 1 is a schematic block diagram of an embodiment of a communication system 10 that includes a plurality of sensor computing devices 12, a plurality of user computing devices 14, a plurality of passive wireless sensors 16-1 through 16-4, one or more wide area networks (WAN), and one or more local area networks (LAN). The passive wireless sensors 16-1 through 16-4, when activated, sense one or more of a variety of conditions. For example, one passive wireless sensor senses for the presence, absence, and/or amount of moisture in a given location (e.g., in a room, in a manufactured item or component thereof (e.g., a vehicle), in a bed, in a diaper, etc.). As another example, a passive wireless sensor senses pressure on and/or in a particular item (e.g., on a seat, on a bed, in a tire, etc.).

As yet another example, a passive wireless sensor senses temperature within a space and/or of an item (e.g., surface temperature of the item, in a confined space such as a room or a box, etc.). As a further example, a passive wireless sensor senses humidity within a space (e.g., a room, a closet, a box, a container, etc.). As a still further example, a passive wireless sensor senses the presence and/or percentages of a gas within a space (e.g., carbon monoxide in a car, carbon monoxide in a room, gas within a food container, etc.). As an even further example, a passive wireless sensor senses the presence and/or percentages of a light within a space. As yet a further example, a passive wireless sensor senses the presence, percentages, and/or properties of one or more liquids in a solution. In one more example, a passive wireless sensor senses location proximity of one item to another and/or the proximity of the passive wireless sensor to an item (e.g., proximity to a metal object, etc.).

In general, the sensor computing devices 12 function to collect the sensed data from the passive wireless sensors and process the sensed data. For example, a passive wireless sensor generates a coded value representative of a sensed condition (e.g., amount of moisture). A sensor computing device 12 receives the coded value and processes it to determine an accurate measure of the sensed condition (e.g., a value corresponding to the amount of moisture such as 0% saturated, 50% saturated, 100% saturated, etc.).

The user computing devices 14 communicate with one or more of the sensor computing devices 12 to gather the accurate measures of sensed conditions for further processing. For example, assume that the wireless communication system is used by a manufacturing company that has multiple locations for assembly of its products. In particular, LAN 1 is at a first location where a first set of components of products are processed and the LAN 2 is at a second location where second components of the products and final assembly of the products occur. Further assume that the corporate headquarters of the company is at a third location, where it communicates with the first and second locations via the WAN and LANs.

In this example, the sensor computing device 12 coupled to LAN 1 collects and processes data regarding the first set of components as sensed by passive wireless sensors 16-1 and 16-2. The sensor computing device 12 is able to communicate this data to the user computing device 14 coupled to the LAN 1 and/or to the computing device 14 at corporate headquarters via the WAN. Similarly, the sensor computing device 12 coupled to LAN 2 collects and processes data regarding the second set of components and final assembly as sensed by passive wireless sensors 16-3 and 16-4. This sensor computing device 12 is able to communicate this data to the user computing device 14 coupled to the LAN 2 and/or to the computing device 14 at corporate headquarters via the WAN. In such a system, real time monitor is available locally (e.g., via the LAN) and is further available non-locally (e.g., via the WAN). Note that any of the user computing devices 14 may receive data from the any of the sensor computing devices 12 via a combination of LANs and the WAN.

Figure 2:
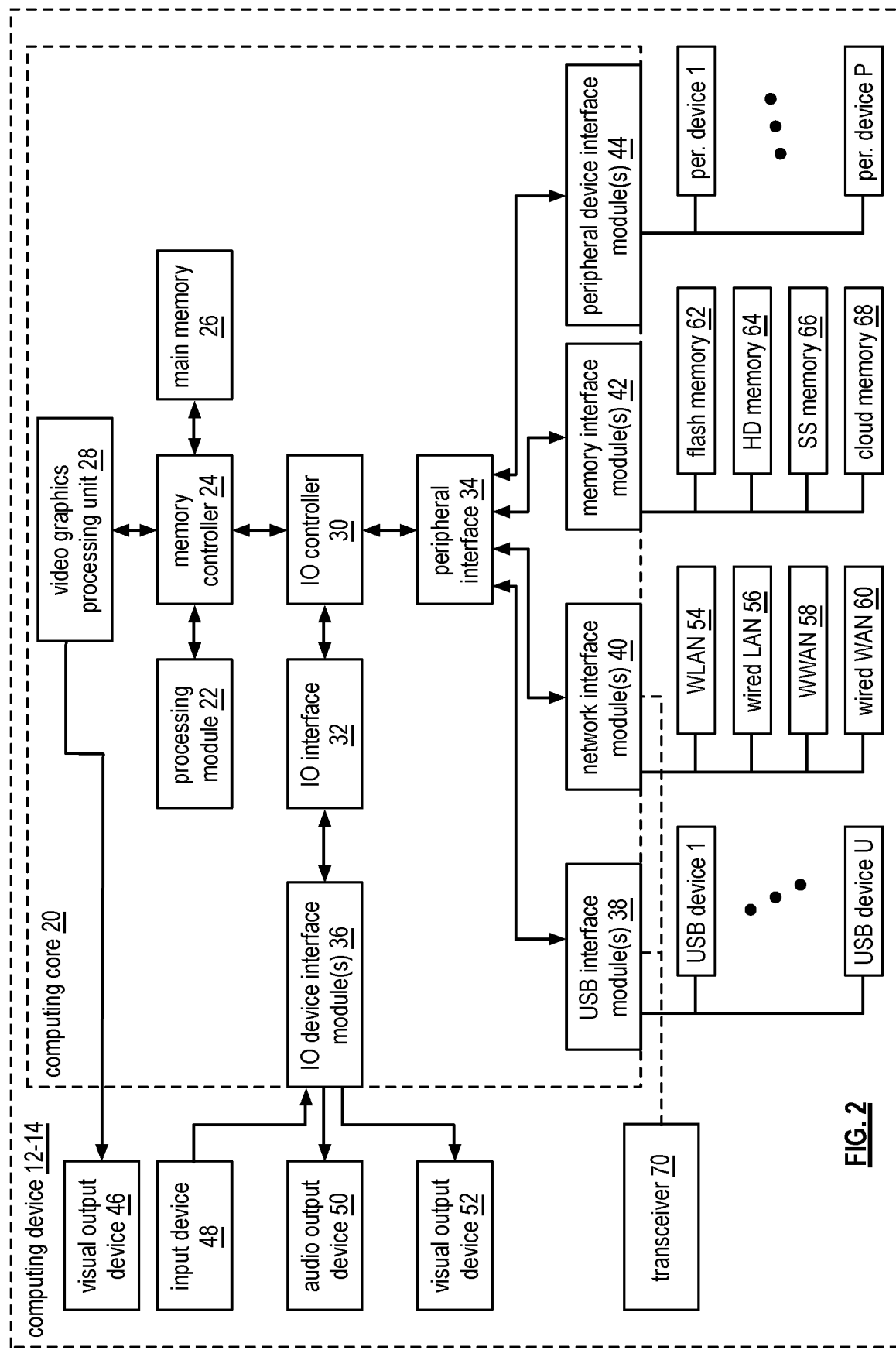
FIG. 2 is a schematic block diagram of an embodiment of a computing device in accordance with the present invention.

FIG. 2 is a schematic block diagram of an embodiment of a computing device 12 and/or 14 that includes a computing core 20, one or more input devices 48 (e.g., keypad, keyboard, touchscreen, voice to text, etc.), one or more audio output devices 50 (e.g., speaker(s), headphone jack, etc.), one or more visual output devices 46 (e.g., video graphics display, touchscreen, etc.), one or more universal serial bus (USB) devices, one or more networking devices (e.g., a wireless local area network (WLAN) device 54, a wired LAN device 56, a wireless wide area network (WWAN) device 58 (e.g., a cellular telephone transceiver, a wireless data network transceiver, etc.), and/or a wired WAN device 60), one or more memory devices (e.g., a flash memory device 62, one or more hard drives 64, one or more solid state (SS) memory devices 66, and/or cloud memory 96), one or more peripheral devices, and/or a transceiver 70.

The computing core 20 includes a video graphics processing unit 28, one or more processing modules 22, a memory controller 24, main memory 26 (e.g., RAM), one or more input/output (I/O) device interface module 36, an input/output (I/O) interface 32, an input/output (I/O) controller 30, a peripheral interface 34, one or more USB interface modules 38, one or more network interface modules 40, one or more memory interface modules 42, and/or one or more peripheral device interface modules 44. Each of the interface modules 36-44 includes a combination of hardware (e.g., connectors, wiring, etc.) and operational instructions stored on memory (e.g., driver software) that is executed by the processing module 22 and/or a processing circuit within the respective interface module. Each of the interface modules couples to one or more components of the computing device 12-14. For example, one of the IO device interface modules 36 couples to an audio output device 50. As another example, one of the memory interface modules 42 couples to flash memory 62 and another one of the memory interface modules 42 couples to cloud memory 68 (e.g., an on-line storage system and/or on-line backup system).

The transceiver 70 is coupled to the computing core 20 via a USB interface module 38, a network interface module 40, a peripheral device interface module 44, or a dedicated interface module (not shown). Regardless of how the transceiver 70 is coupled to the computing core, it functions to communicate with the passive wireless sensors.

Figure 3:
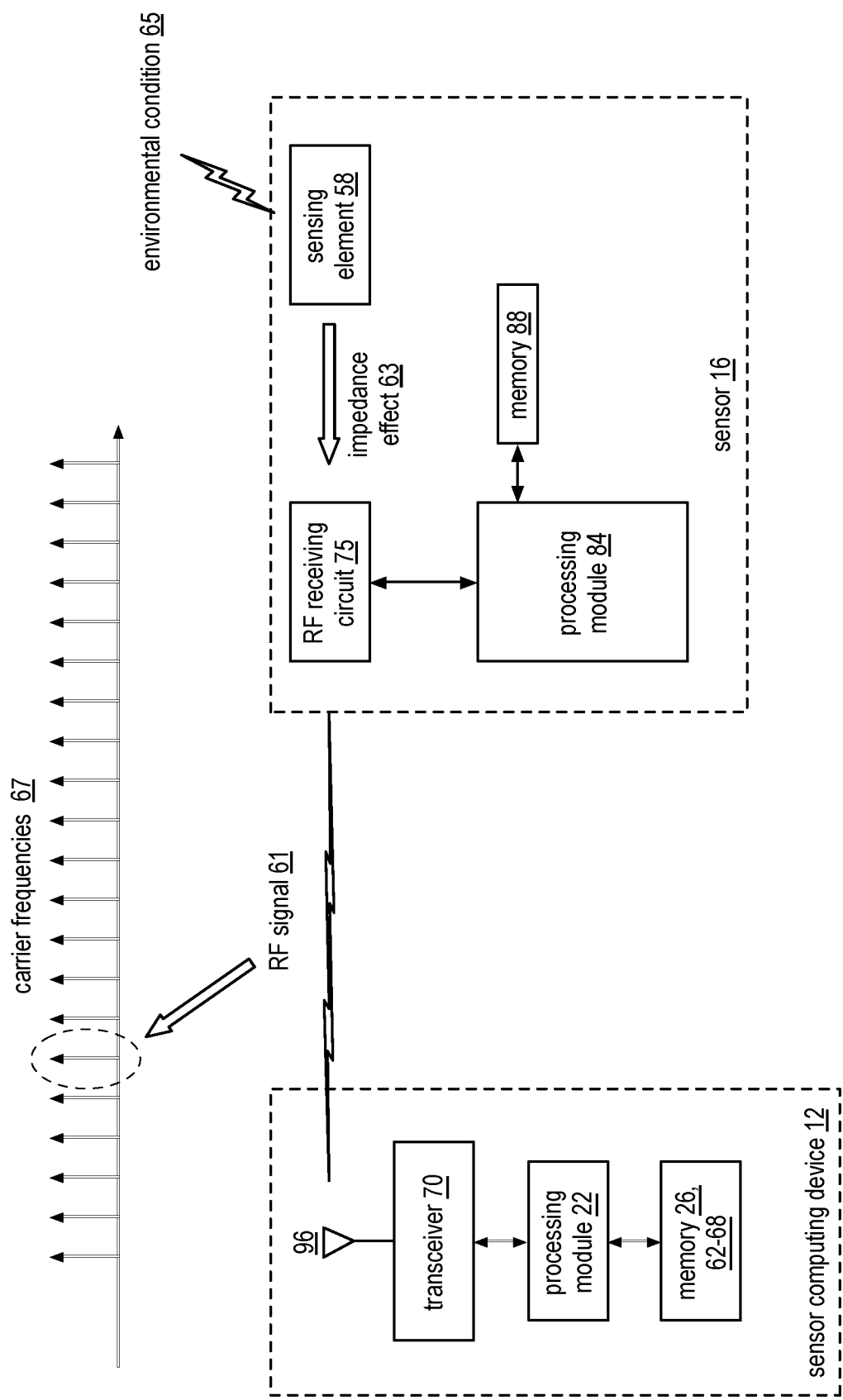
FIG. 3 is a schematic block diagram of an example of a sensor computing device communicating with a passive wireless sensor in accordance with the present invention.

FIG. 3 is a schematic block diagram of an example of a sensor computing device 12 communicating with a passive wireless sensor 16 (e.g., any one of 16-1 through 16-4). The sensor computing device 12 is illustrated in a simplified manner; as such, it shown to include the transceiver 70, an antenna 96, the processing module 22, and the memory (e.g., one or more 26 and 62-68). The passive wireless sensor 16 includes a radio frequency (RF) receiving circuit 75, one or more sensing elements 58, a processing module 84, and a memory 88. The RF receiving circuit 75 is operable to receive a radio frequency (RF) signal 61 that has a carrier frequency of a plurality of carrier frequencies 67. The RF receiving circuit includes a plurality of components and the impedance of those components establish a resonant frequency of the RF receiving circuit.

In an example, the sensing element 58 of the passive wireless sensor 16 senses an environmental condition 65 of an object. The environmental condition includes, but is not limited to, one or more of moisture, temperature, pressure, humidity, altitude, sonic wave (e.g., sound), human contact, surface conditions, tracking, location (e.g., proximity), etc. The object includes one or more of, but is not limited to, a box, a personal item (e.g., clothes, diapers, etc.), a pet, an automobile component, an article of manufacture, an item in transit, etc. The sensing element 58 senses the environmental condition (e.g., moisture) and, as a result of the sensed condition, the sensing element 58 affects an operational parameter (e.g., input impedance, quality factor, frequency, etc.) of the plurality of components of the RF receiving circuit 75. As a specific example, the sensing element 58, as a result of the sensed environmental condition 65, causes an impedance effect 63 on the RF receiving circuit 75 that affects the resonant frequency of the RF receiving circuit 75.

The processing module 84 is operable to determine a first value for an adjustable element of a plurality of elements for a known environmental condition based on the resonant frequency of the RF receiving circuit and the carrier frequency of the RF signal. The plurality of elements includes the plurality of carrier frequencies 67 and the impedances of the plurality of components of the RF receiving circuit (e.g., capacitor, antenna, and/or inductor of the RF receiving circuit). In this example, one of the components of the plurality of elements is adjustable and the other elements of the plurality of elements are fixed elements. To determine the first value, the processing module may, for a range of values for the adjustable element, determine power levels for the received RF signal, and identify a value of the range of values corresponding to a peak power level of the power levels as the first value.

The processing module 84 then determines a second value for the adjustable element for an unknown environmental condition based on the resonant frequency and the carrier frequency. To determine the second value, the processing module determines, for a range of values for the adjustable element, power levels for the received RF signal, and identifies a value of the range of values corresponding to a peak power level of the power levels as the second value.

The processing module 84 is then determines a difference between the first and second values that corresponds to a change between the known environmental condition and the unknown environmental condition. The amount of the change is reflective of the level of the environmental condition (e.g., a little change corresponds to a little moisture; a large change corresponds to a large amount of moisture). The processing module 84 generates a coded value to represent the amount of adjustment and conveys the coded value to the sensor computing device 12.

Figure 4:
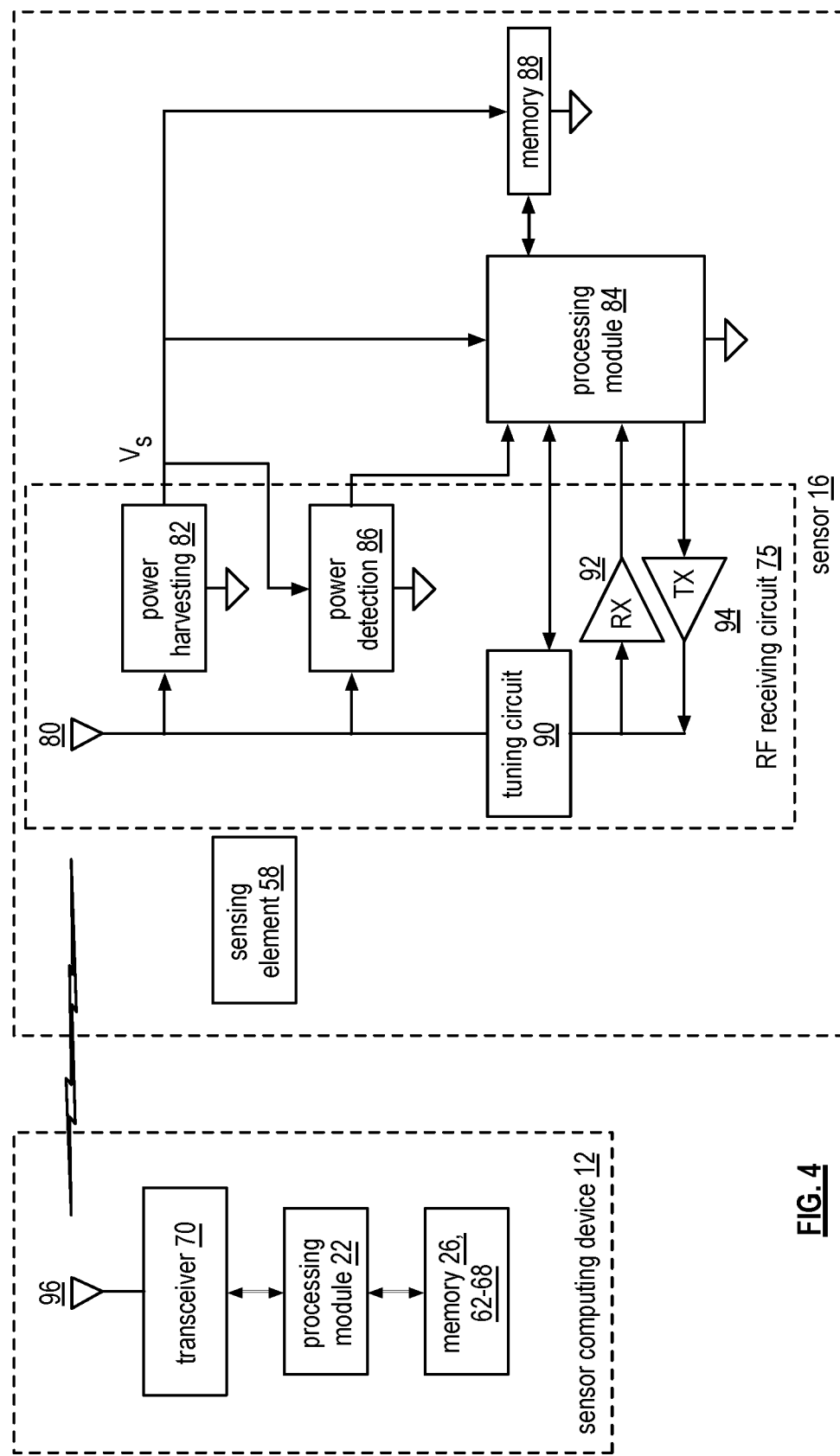
FIG. 4 is a schematic block diagram of another example of a sensor computing device communicating with a passive wireless sensor in accordance with the present invention.

FIG. 4 is a schematic block diagram of an embodiment of another example of the sensor computing device 12 communicating with the passive wireless sensor (e.g., any one of 16-1 through 16-4). The passive wireless sensor 16 includes a radio frequency (RF) receiving circuit 75, one or more sensing elements 58, a processing module 84, and a memory 88. The RF receiving circuit includes a plurality of components which may include an antenna 80, a power harvesting circuit 82, a power detection circuit 86, a tuning circuit 90, a receiver section 92, and/or a transmitter section 94.

In an example, the sensing element 58 of the passive wireless sensor 16 senses an environmental condition of an object. The environment condition includes, but is not limited to, one or more of moisture, temperature, pressure, humidity, altitude, sonic wave (e.g., sound), human contact, surface conditions, tracking, location, etc. The object includes one or more of, but is not limited to, a box, a personal item (e.g., clothes, diapers, etc.), a pet, an automobile component, an article of manufacture, an item in transit, etc. The sensing element 58 senses the environmental condition (e.g., moisture) and, as a result of the sensed condition, the sensing element 58 affects an operational parameter (e.g., input impedance, quality factor, frequency, etc.) of an RF front end of the passive wireless sensor. Note that the RF front end includes one or more of the antenna 80, the tuning circuit 90, the transmitter section 94, the receiver section 92.

As a specific example, the sensing element 58, as a result of the sensed environmental condition 65, causes an impedance effect on the RF receiving circuit 75, an effect on the input impedance of the antenna structure 80 and/or of the tuning circuit 90 (e.g., a tank circuit that includes one or more capacitors and one or inductors having a resonant frequency corresponding to the carrier frequency of the RF signal). In response to the impedance change, the processing module 84 determines a first value for an adjustable element of a plurality of elements for a known environmental condition based on the resonant frequency of the RF receiving circuit and the carrier frequency of the RF signal. The processing module then determines a second value for the adjustable element for an unknown environmental condition based on the resonant frequency and the carrier frequency. The processing module 84 is then able to determine a difference between the first and second values that corresponds to a change between the known environmental condition and the unknown environmental condition. The amount of adjustment is reflective of the level of the environmental condition (e.g., a little change corresponds to a little moisture; a large change corresponds to a large amount of moisture). The processing module 84 generates a coded value, the adjusted impedance, or other representation of the adjusted impedance, to represent the amount of adjustment and conveys the coded value to the sensor computing device 12 via the transmitter section 94 and the antenna 80 using back-scattering.

In addition to processing the sensed environmental condition, the processing module 84 processes a power level adjustment. For example, the power detection circuit 86 detects a power level of the received RF signal. In one embodiment, the processing module interprets the power level and communicates with the sensor computing device 12 to adjust the power level of the RF signal transmitted by the computing device 12 to a desired level (e.g., optimal for accuracy in detecting the environmental condition). In another embodiment, the processing module 84 includes the received power level data with the environmental sensed data it sends to the sensor computing device 12 so that the computing device can factor the power level into the determination of the environmental condition.

FIG. 5 is a schematic block diagram of an example of a plurality of components of a radio frequency (RF) receiving circuit. The plurality of components of the RF receiving circuit includes an antenna operable to receive an RF signal, and a tuning circuit. The inductance of antenna 80 is coupled to a capacitor 93 (e.g., one or more of a varactor and a selectable capacitor bank) to form a tank circuit 97. The tuning circuit 90 includes an adjusting circuit 91. When the antenna 80 corresponds to the adjustable element, the adjusting circuit 91 adjusts the characteristics of the antenna to affect the resonant frequency. When the capacitor 93 corresponds to the adjustable element, the adjusting circuit 91 adjusts the capacitance of the capacitor 93 to affect the resonant frequency. Alternatively, a processing module of the sensor computing device is operable to adjust the characteristics of the antenna or the capacitance.

FIG. 6 is a schematic block diagram of another example of a plurality of components of a radio frequency (RF) receiving circuit. The plurality of components of the RF receiving circuit includes an antenna 90 operable to receive an RF signal, and a tuning circuit. The tuning circuit 90 includes an adjusting circuit 91, a capacitor 93 (e.g., one or more of a varactor and a selectable capacitor bank), and an inductor 95. The capacitor 93 and the inductor 95 are coupled to form a tank circuit 97 that is operably coupled to the antenna 80.

When the antenna corresponds to the adjustable element, the adjusting circuit 91 adjusts the characteristics of the antenna 80 to affect the resonant frequency. When the capacitor 93 corresponds to the adjustable element, the adjusting circuit 91 adjusts the capacitance of the capacitor 93 to affect the resonant frequency. When the inductor 95 corresponds to the adjustable element, the adjusting circuit 91 adjusts inductance of the inductor 95 to affect the resonant frequency. Alternatively, a processing module of the sensor computing device is operable to adjust the characteristics of the antenna, the capacitance, or the inductor.

Figure 7:
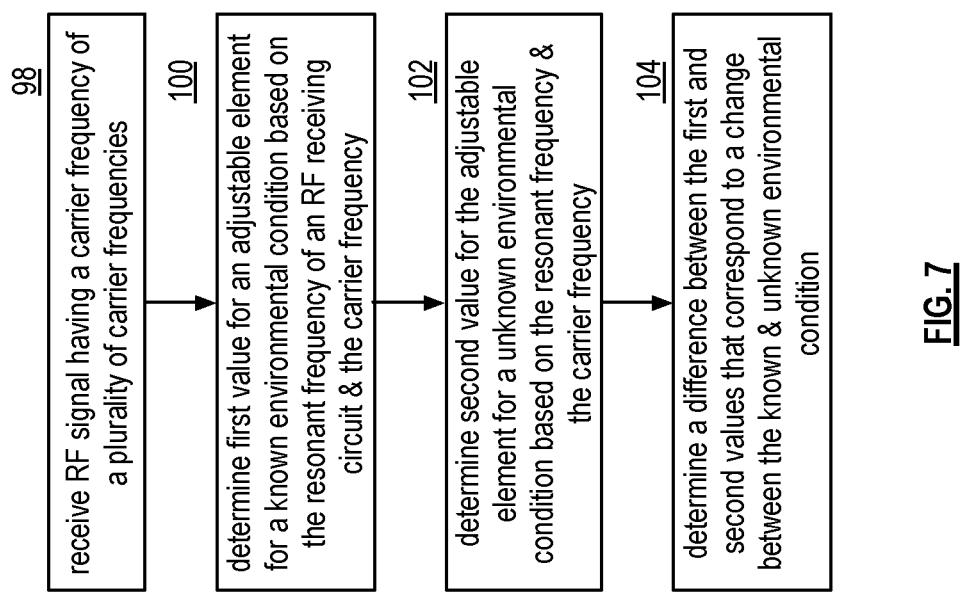
FIG. 7 is a logic diagram of an example of determining a change in an environmental condition in accordance with the present invention.

FIG. 7 is a logic diagram of an example of determining a change in an environmental condition. The method begins at step 98 where a wireless sensor (e.g., the passive wireless sensor 16) receives a radio frequency (RF) signal having a carrier frequency of a plurality of carrier frequencies. An RF receiving circuit of the wireless sensor includes a plurality of components, and the impedance of those components establish a resonant frequency of the RF receiving circuit. A sensing element of the wireless sensor is proximally positioned with respect to the RF receiving circuit and to sense an environmental condition. When the sensing element is exposed to the environmental condition, the sensing element affects the resonant frequency of the RF receiving circuit. The environmental condition includes, but is not limited to, one or more of moisture, temperature, pressure, humidity, altitude, sonic wave (e.g., sound), human contact, surface conditions, tracking, location, proximity, etc.

The method continues at step 100 where the wireless sensor determines a first value for an adjustable element of a plurality of elements for a known environmental condition based on the resonant frequency of the RF receiving circuit and the carrier frequency of the RF signal. The plurality of elements includes the plurality of carrier frequencies and the impedances of the plurality of components of the RF receiving circuit. One of the components of the plurality of elements is adjustable and the other elements of the plurality of elements are fixed elements. For example, the plurality of components of the RF receiving circuit may include an antenna operable to receive an RF signal, a capacitor e.g., one or more of a varactor and a selectable capacitor bank), and/or an inductor. When the antenna corresponds to the adjustable element, the characteristics of the antenna are adjusted to affect the resonant frequency. When the capacitor corresponds to the adjustable element, the capacitance is adjusted to affect the resonant frequency. When the inductor corresponds to the adjustable element, the inductance is adjusted to affect the resonant frequency. Further, the wireless sensor may request a change in the carrier frequency of the RF signal, when the carrier frequency corresponds to the adjustable element.

To determine the first value, the processing module may, for a range of values for the adjustable element, determine power levels for the received RF signal, and identify a value of the range of values corresponding to a peak power level of the power levels as the first value.

The method continues at step 102 where the wireless sensor determines a second value for the adjustable element for an unknown environmental condition based on the resonant frequency and the carrier frequency. To determine the second value, the processing module may, for a range of values for the adjustable element, determine power levels for the received RF signal, and identify a value of the range of values corresponding to a peak power level of the power levels as the second value.

The method continues at step 104 where the wireless sensor determines a difference between the first and second values that corresponds to a change between the known environmental condition and the unknown environmental condition. The amount of the change is reflective of the level of the environmental condition (e.g., a little change corresponds to a little moisture; a large change corresponds to a large amount of moisture).

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:
1. A wireless sensor comprises:
a radio frequency (RF) receiving circuit operable to receive an RF signal having a carrier frequency, the RF receiving circuit includes a variable impedance, wherein impedance of the variable impedance is a factor in establishing a resonant frequency of the RF receiving circuit; and
a processing module operably coupled to the RF receiving circuit, wherein the processing module is operable to:
determine a first value for a first impedance of the variable impedance for a known temperature based on the resonant frequency and the carrier frequency;

determine a second value for a second impedance of the variable impedance for an unknown temperature based on the resonant frequency and the carrier frequency; and determine a difference between the first and second values that corresponds to a change between the known temperature and the unknown temperature.

2. The wireless sensor of claim 1, wherein the variable impedance comprises:
an antenna operable to receive the RF signal; and
a variable capacitor coupled to the antenna to form a tank circuit.

3. The wireless sensor of claim 2, wherein the first impedance is established by
characteristics of the variable impedance.

4. The wireless sensor of claim 2, wherein the second impedance is established by
adjusting characteristics of the variable impedance.

5. The wireless sensor of claim 1, wherein the variable impedance comprises:
an antenna operable to receive the RF signal;
a variable capacitor; and
an inductor, wherein the variable capacitor and at least one of the antenna and the inductor are coupled to form a tank circuit.

6. The wireless sensor of claim 5, wherein the first impedance is established by
characteristics of the variable impedance.

7. The wireless sensor of claim 5, wherein the second impedance is established by
adjusting characteristics of the variable impedance.

8. The wireless sensor of claim 1, wherein the processing module is further operable to determine the first value by:
for a range of values for the first impedance, determining power levels for the received RF signal; and
identifying a value of the range of values corresponding to a peak power level of the power levels as the first value.

9. The wireless sensor of claim 1, wherein the processing module is further operable to determine the second value by:
for a range of values for the second impedance, determining power levels for the received RF signal; and
identifying a value of the range of values corresponding to a peak power level of the power levels as the second value.

10. A method for execution by a wireless sensor, the method comprises:
receiving a radio frequency (RF) signal having a carrier frequency, wherein an RF receiving circuit of the wireless sensor includes a variable impedance, wherein impedance of the variable impedance is a factor in establishing a resonant frequency of the RF receiving circuit;
determining a first value for a first impedance of the variable impedance for a known temperature based on the resonant frequency and the carrier frequency;
determining a second value for a second impedance of the variable impedance for an unknown temperature based on the resonant frequency and the carrier frequency; and
determining a difference between the first and second values that corresponds to a change between the known temperature and the unknown temperature.

11. The method of claim 10, wherein the variable impedance comprises:
an antenna operable to receive the RF signal; and
a variable capacitor coupled to the antenna to form a tank circuit.

12. The method of claim 11, wherein the first impedance is established by
characteristics of the variable impedance.

13. The method of claim 11, wherein the second impedance is established by
adjusting characteristics of the variable impedance.

14. The method of claim 10, wherein the variable impedance comprises:
an antenna operable to receive the RF signal;
a variable capacitor; and
an inductor, wherein the variable capacitor and at least one of the antenna and the inductor are coupled to form a tank circuit.

15. The method of claim 14, wherein the first impedance is established by
characteristics of the variable impedance.

16. The method of claim 14, wherein the second impedance is established by
adjusting characteristics of the variable impedance.

17. The method of claim 10, wherein the determining the first value further comprises:
for a range of values for the first impedance, determining power levels for the received RF signal; and
identifying a value of the range of values corresponding to a peak power level of the power levels as the first value.

18. The method of claim 10, wherein the determining the second value further comprises:
for a range of values for the second impedance, determining power levels for the received RF signal; and
identifying a value of the range of values corresponding to a peak power level of the power levels as the second value.

* * * * *